United States Patent
Lee et al.

(10) Patent No.: US 10,580,983 B2
(45) Date of Patent: Mar. 3, 2020

(54) ULTRA-FAST METHOD FOR FORMATION OF ORGANIC/INORGANIC THIN FILM BY USING SPONTANEOUS SPREADING EFFECT

(71) Applicant: KOREA ADVANCED INSTITUTE OF SCIENCE AND TECHNOLOGY, Daejeon (KR)

(72) Inventors: Jung Yong Lee, Daejeon (KR); Seon Ju Jeong, Daejeon (KR); Jong Hyeon Noh, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 68 days.

(21) Appl. No.: 15/744,137

(22) PCT Filed: May 19, 2016

(86) PCT No.: PCT/KR2016/005336
§ 371 (c)(1),
(2) Date: Feb. 5, 2018

(87) PCT Pub. No.: WO2017/010674
PCT Pub. Date: Jan. 19, 2017

(65) Prior Publication Data
US 2018/0212148 A1    Jul. 26, 2018

(30) Foreign Application Priority Data
Jul. 16, 2015   (KR) .................. 10-2015-0101194

(51) Int. Cl.
*H01L 51/40*   (2006.01)
*H01L 51/00*   (2006.01)
(Continued)

(52) U.S. Cl.
CPC ........ *H01L 51/0003* (2013.01); *H01L 51/003* (2013.01); *H01L 51/0096* (2013.01);
(Continued)

(58) Field of Classification Search
CPC ................................................... H01L 51/0003
(Continued)

(56) References Cited

U.S. PATENT DOCUMENTS

| 7,713,779 B2 * | 5/2010 | Firon | ................ B82Y 10/00 |
| | | | 257/40 |
| 9,416,456 B1 * | 8/2016 | Ram | ...................... C25B 1/003 |

(Continued)

FOREIGN PATENT DOCUMENTS

| JP | 2009-238939 | 10/2009 |
| KR | 10-2005-0086503 | 8/2005 |

(Continued)

OTHER PUBLICATIONS

International Search Report dated Sep. 23, 2016 for PCT/KR2016/005336.

*Primary Examiner* — Caleb E Henry

(57) ABSTRACT

According to the present invention, an ultra-fast method for preparing an organic/inorganic thin film by using self-diffusion effects comprises the steps of: forming a solution by dissolving one or more organic/inorganic materials in a solvent; forming an organic/inorganic thin film by supplying the formed solution onto a liquid substrate; and transferring the formed thin film to a substrate, wherein the step of forming an organic/inorganic thin film forms a thin film on the liquid substrate from the organic/inorganic materials through the occurrence of a self-diffusion phenomenon caused by a difference in surface tension between the liquid substrate and the solution, and through the occurrence of the (Continued)

evaporation of the solvent and the dissolution process of the solvent to the liquid substrate.

11 Claims, 5 Drawing Sheets

(51) Int. Cl.

| | | |
|---|---|---|
| *H01L 51/05* | (2006.01) | |
| *H01L 51/42* | (2006.01) | |
| *H01L 51/50* | (2006.01) | |
| *H01L 51/56* | (2006.01) | |
| *H01L 31/0256* | (2006.01) | |

(52) U.S. Cl.
CPC ...... *H01L 51/0097* (2013.01); *H01L 51/0545* (2013.01); *H01L 51/0558* (2013.01); *H01L 51/4213* (2013.01); *H01L 51/5012* (2013.01); *H01L 51/56* (2013.01); *H01L 51/0035* (2013.01); *H01L 51/0036* (2013.01); *H01L 51/0043* (2013.01); *H01L 51/0047* (2013.01); *H01L 51/0077* (2013.01); *H01L 51/4253* (2013.01); *H01L 51/5024* (2013.01); *H01L 51/5056* (2013.01); *H01L 2031/0344* (2013.01); *H01L 2251/5338* (2013.01)

(58) Field of Classification Search
USPC .......................................................... 438/99
See application file for complete search history.

(56) References Cited

U.S. PATENT DOCUMENTS

| | | | | |
|---|---|---|---|---|
| 2003/0226498 | A1* | 12/2003 | Alivisatos | .............. B82Y 20/00 |
| | | | | 117/84 |
| 2004/0095658 | A1* | 5/2004 | Buretea | .................. B82Y 20/00 |
| | | | | 359/853 |
| 2006/0262393 | A1* | 11/2006 | Toyoda | ............ B29D 11/00278 |
| | | | | 359/456 |

FOREIGN PATENT DOCUMENTS

| | | |
|---|---|---|
| KR | 10-2007-0100221 | 10/2007 |
| KR | 10-2010-0031036 | 3/2010 |
| KR | 10-2012-0100591 | 9/2012 |
| KR | 10-2012-0102110 | 9/2012 |
| KR | 10-1189172 | 10/2012 |

* cited by examiner

ULTRA-FAST METHOD FOR FORMATION OF ORGANIC/INORGANIC THIN FILM BY USING SPONTANEOUS SPREADING EFFECT

This application claims the priority of Korean Patent Application No. 10-2015-0101194, filed on Jul. 16, 2015 in the KIPO (Korean Intellectual Property Office), the disclosure of which is incorporated herein entirely by reference. Further, this application is the National Stage application of International Application No. PCT/KR2016/005336, filed May 19, 2016, which designates the United States and was published in Korean. Each of these applications is hereby incorporated by reference in their entirety into the present application.

TECHNICAL FIELD

The present disclosure provides a method for forming a thin film on a liquid substrate. Specifically, it relates to a method for forming an organic/inorganic thin film through the surface tension between a liquid substrate and a solution by supplying the solution to the liquid substrate.

BACKGROUND ART

The fabrication of an organic/inorganic thin film is a fundamental technology in nanotechnology. It is a technology essential for most electronic devices such as mobile phones, military equipment, solar cells, etc., which need to be lightweight, thin and bendable.

Vacuum deposition has been the representative technology for formation of an organic/inorganic thin film since the mid-20th century. There has been a lot of advancement focused on electronic materials and many methods have been proposed. The vacuum deposition techniques include physical deposition and chemical deposition methods. And the wet deposition techniques include electro-plating, spin coating, slot-die coating, etc.

High-performance electronic devices using organic/inorganic thin films are being researched actively around the world. Also, in the industry, investments are being made consistently in the development of new technology for productivity improvement and cost reduction because the organic/inorganic thin film formation is a fundamental technology in electronic devices such as semiconductors, displays and solar cells. In the light of this global trend, it is expected that the investment will be expanded further and competitions for breakthrough thin film formation technologies that can produce thinner and cost-effective devices will become more increasingly fierce.

Organic solar cells can be given as an example of the reason why a new technology for forming organic thin films is necessary. The organic solar is drawing attentions as a next-generation solar cell because it can be produced at low cost and is light and flexible. With low price and light weight, it is applicable to most fields where energy harvesting is necessary, such as batteries for mobile phones, military equipment, etc.

Despite the high marketability and applicability, there is an obstacle to the commercialization of the organic solar cell considered as the next-generation energy source due to the difficulties in large-scale process and the R2R (roll-to-roll) process. Although many researches are being conducted on processes for large-scale process, it is difficult to fabricate large area organic solar cells with high efficiency due to the difficulty in the control of nanomorphology over a large area.

Although the spin coating method has been considered the most effective method for fabricating high-efficiency organic solar cells capable of controlling nanomorphology, it is disadvantageous in that it is inappropriate for commercialization because it is impossible to achieve large-area thin film. Although large-area thin film can be achieved with many thin film forming methods such as doctor blading, slot-die coating, etc., it is difficult to fabricate high-efficiency organic solar cells due to the difficulty in forming uniform thin films because they are very sensitive to such factors as ink composition, interaction between the ink and the surface, etc.

Reference can be made to Korean Patent Registration No. 10-1189172, which was granted on Oct. 2, 2012 and issued on Oct. 10, 2012, for a method for fabricating a large-area organic solar cell. Although the patent describes that a thin film for a large-area organic solar cell with a flat surface can be prepared by using a spray coating apparatus wherein a feed solution is injected into a center portion and a high-pressure gas is injected around the center portion, it does not solve the problem of significant material loss during the thin film formation through spin coating or remarkably improve the uniformity of the thin film.

(Patent Document 1) KR 10-1189172 B

DISCLOSURE OF THE INVENTION

Technical Problem

The present disclosure is directed to providing a method for forming a uniform single-layer or multi-layer organic/inorganic thin film with improved air-stability very quickly and effectively on a liquid substrate with little material loss by using the difference in surface tension between solutions.

Technical Solution

An ultra-fast method for forming an organic/inorganic thin film by using a spontaneous spreading effect according to the present disclosure includes: a step of preparing a solution by dissolving one or more organic/inorganic material in a solvent; a step of forming an organic/inorganic thin film by supplying the prepared solution onto a liquid substrate; and a step of transferring the formed thin film to a substrate, wherein, in the step of forming the organic/inorganic thin film, the organic/inorganic material forms the thin film on the liquid substrate through a spontaneous spreading phenomenon caused by a difference in surface tension between the liquid substrate and the solution and through evaporation of the solvent and a dissolution process of the solvent to the liquid substrate.

In the step of forming the organic/inorganic thin film, a single-layer or multi-layer thin film is formed on the liquid substrate by a solution wherein a single or composite organic/inorganic material is dissolved in a solvent.

The organic/inorganic material includes one or more of an organic compound including a conjugated polymer or a conjugated small molecule such as a polybenzothiophene derivative, a polythiophene derivative, a poly(p-phenylene) derivative, a polyfluorene derivative, a polyacetylene derivative, a polypyrrole derivative, a polyvinylcarbazole derivative, a polyaniline derivative and a polyphenylenevinylene derivative, an n-type polymer compound such as a polyperylene derivative, a fullerene derivative such as fullerene ($C_{60}$), [6,6]-phenyl-$C_{61}$-butyric acid methyl ether (PCBM), [6,6]-phenyl-$C_{71}$-butyric acid methyl ether (PC70BM), an inorganic/organic hybrid perovskite compound of a perovskite structure containing an amidinium ion and an organic ammonium ion as monovalent organic cations, a divalent metal ion as an inorganic cation and a halogen ion as an anion, or an inorganic semiconductor quantum dot compound selected from CdS, CdSe, CdTe, PbS, PbSe, $PbS_xSe_{1-x}$ (0<x<1), $Bi_2S_3$, $Bi_2Se_3$, InP, $InCuS_2$, $In(CuGa)Se_2$, $Sb_2S_3$, $Sb_2Se_3$, $SnS_x$ (1≤x≤2), NiS, CoS, $FeS_x$ (1≤x≤2), $In_2S_3$, MoS and MoSe.

The liquid substrate is one having a higher surface tension than the solvent, selected from a group consisting of distilled water, glycerol, formamide and ethylene glycol.

The solvent is one capable of dissolving the organic/inorganic material and having a difference in surface tension with the liquid substrate such that a spontaneous spreading effect can occur, selected from a group consisting of chlorobenzene, chloroform, toluene and dichlorobenzene.

The substrate to which the organic/inorganic thin film is transferred is one of a flexible polymer substrate, a metal substrate and a glass substrate.

The flexible polymer substrate is one selected from a group consisting of polydimethylsiloxane (PDMS), polyethylene terephthalate (PET), polyethylene naphthalate (PEN) polyethylene (PE), polyethersulfone (PES), polycarbonate (PC), polyarylate (PAR) and polyimide (PI).

The metal substrate is one selected from a group consisting of SUS (steel use stainless), aluminum, steel and copper.

The present disclosure provides an organic/inorganic thin film prepared by the method for forming an organic/inorganic thin film described above.

The present disclosure provides an organic/inorganic electronic device containing the organic/inorganic thin film.

The organic/inorganic electronic device is one of a solar cell, a light-emitting diode and a transistor.

Advantageous Effects

The present disclosure relates to a method for forming an organic/inorganic thin film on a liquid substrate by using the surface tension between the liquid substrate and a solution and allows for fabrication of an organic/inorganic electronic device including a solar cell, a light-emitting diode, a thin-film transistor, etc.

According to the present disclosure, a uniform organic/inorganic thin film can be formed very quickly and effectively with little material loss and the process is very simple because the formed thin film can be transferred freely to a glass, plastic or metal substrate without additional treatment.

In addition, the present disclosure can improve the efficiency of an organic/inorganic electronic device because the nanomorphology of the thin film can be controlled effectively during the crystallization, orientation and phase separation of materials.

Also, in the present disclosure, the organic/inorganic solution used for spin coating can be utilized without modification. That is to say, the present disclosure solves the problems occurring during thin film formation by the conventional spin coating method that about 90% or more material is lost and it is difficult to attain a uniform thin film because a lot of time is required for optimization due to high sensitivity to such factors as ink composition, interaction between the ink and the surface, etc.

In addition, the present disclosure allows for effective formation of a multi-layer thin film without limitation to solvent or material. When a multi-layer thin film is formed by the spin coating method, there is a limitation that a solvent which does not dissolves the thin film of the lower layer has to be used. In contrast, according to the present disclosure, a multi-layer thin film can be prepared from various materials because the formed thin film can be transferred freely.

Whereas the existing thin film formation method such as spin coating is limited in that the process should be conducted under a nitrogen atmosphere because of change in material characteristics due to oxygen or water, the present disclosure can ensure the atmospheric stability of the thin film material because the thin film is formed very quickly. In addition, price competitiveness can be ensured because an organic/inorganic electronic device can be fabricated under an air atmosphere.

The present disclosure can save the time and cost required for the formation and transfer of a thin film and can improve price competitiveness in the manufacturing of solar cells, light-emitting diodes and transistors.

In addition, it is applicable to wearable flexible organic/inorganic electronic devices requiring flexibility and low cost because it allows various substrates to be used.

MODE FOR CARRYING OUT THE INVENTION

Figure 1:
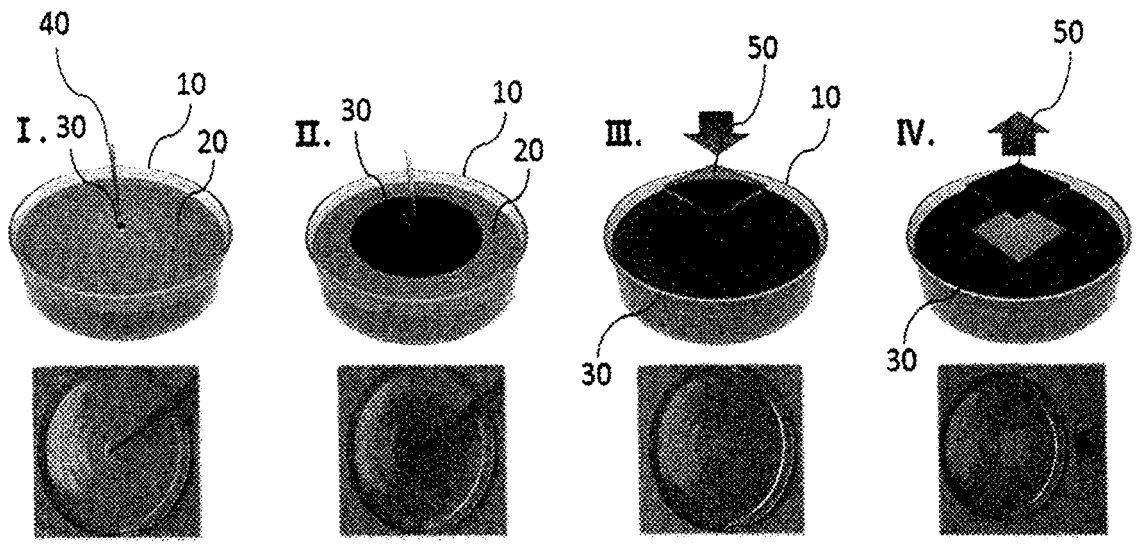
FIG. 1 schematically shows an ultra-fast organic/inorganic thin film preparation and transfer process by using a spontaneous spreading effect according to the present disclosure.

Hereinafter, the exemplary embodiments of the present disclosure will be described in detail with reference to the attached drawings. However, the present disclosure is not limited by the exemplary embodiments described below but may be embodied in various ways. The exemplary embodiments are provided so that the description of the present disclosure is complete and the scope of the present disclosure is completely conveyed to those of ordinary skill. In the drawings, like numerals refer to like elements.

The present disclosure provides a method for forming a thin film with a nanomorphology effectively controlled during crystallization, phase separation, etc. without the loss of a supplied solution by using the spontaneous spreading phenomenon on a liquid substrate, with minimized modification of the existing organic/inorganic solution for spin coating and allows for fabrication of a high-efficiency organic electronic device at low cost.

The method of the present disclosure includes a step of preparing a solution by dissolving one or more organic/inorganic material in a solvent and a step of forming an organic/inorganic thin film by supplying the prepared solution onto a liquid substrate. The present disclosure provides a method for forming the layers of an organic/inorganic electronic device by using the spontaneous spreading phenomenon.

An ultra-fast method for forming and transferring a large-area organic/inorganic thin film by using the spontaneous spreading effect is described referring to FIG. 1.

First, a solution 30 is formed before the solution 30 is supplied onto a liquid substrate 20 accommodated in a container 10.

The solution 30 is prepared by adding one or more organic/inorganic material to a solvent and dissolving sufficiently under an inert gas condition. If necessary, the nanomorphology can be controlled by further adding an additive. The organic/inorganic material added to the solvent is dissolved in the solvent to form the solution and is used in the finally fabricated organic/inorganic thin-film device. The solvent may be used to dissolve an organic material and has the property of spreading on the liquid substrate 20.

For example, the organic/inorganic material added to the solvent may be one or more of an organic compound including a conjugated polymer or a conjugated small molecule such as a polybenzothiophene derivative, a polythiophene derivative, a poly(p-phenylene) derivative, a polyfluorene derivative, a polyacetylene derivative, a polypyrrole derivative, a polyvinylcarbazole derivative, a polyaniline derivative and a polyphenylenevinylene derivative, an n-type polymer compound such as a polyperylene derivative, a fullerene derivative such as fullerene (Coo), [6,6]-phenyl-$C_{61}$-butyric acid methyl ether (PCBM), [6,6]-phenyl-$C_{71}$-butyric acid methyl ether (PC70BM), an inorganic/organic hybrid perovskite compound of a perovskite structure containing an amidinium ion and an organic ammonium ion as monovalent organic cations, a divalent metal ion as an inorganic cation and a halogen ion as an anion, or an inorganic semiconductor quantum dot compound selected from CdS, CdSe, CdTe, PbS, PbSe, $PbS_xSe_{1-x}$ (0<x<1), $Bi_2S_3$, $Bi_2Se_3$, InP, $InCuS_2$, In(CuGa)$Se_2$, $Sb_2S_3$, $Sb_2Se_3$, $SnS_x$ (1≤x≤2), NiS, CoS, $FeS_x$ (1≤x≤2), $In_2S_3$, MoS and MoSe, although not being limited thereto.

For example, the liquid substrate may be a solvent which does not dissolve the organic/inorganic material and has a higher surface tension than the solvent, including distilled water, glycerol, formamide, ethylene glycol, etc.

For example, the solvent may be a solvent which dissolves the organic/inorganic material and has a difference in surface tension with the liquid substrate such that a spontaneous spreading effect can occur, including chlorobenzene, chloroform, toluene, dichlorobenzene, etc.

FIG. 1 shows that, due to the surface tension between the liquid substrate 20 and the solution 30, a polymer which is an organic material spreads thinly on the liquid substrate 20 through evaporation and dissolution of the solvent. That is to say, the spontaneous spreading of the organic/inorganic solution 30 occurs due to the difference in the surface tension with the liquid substrate 20 and the solvent is evaporated into the air and, at the same time, is dissolved into the liquid substrate during the diffusion.

Next, a step of forming a thin film on the liquid substrate 20 by using the formed solution 30 is described referring to FIG. 1. The liquid substrate 20 may be a liquid which has a high surface tension and does not dissolve the organic/inorganic material, such as water.

In FIG. 1, I through IV show a process whereby an organic/inorganic thin film is transferred from the solution 30 supplied onto the liquid substrate 20.

Specifically, I and II of FIG. 1 show the step of forming a thin film. A trace amount of the solution 30 is added dropwise to the liquid substrate 20 under an air atmosphere at room temperature using a pipette 40 or a syringe and is allowed to stand until the solvent dissolving the organic/inorganic material is completely dissolved into the liquid substrate 20 or evaporated into the air.

III and IV of FIG. 1 show the step of separating and transferring the thin film. A target substrate 50 to which the organic/inorganic thin film is to be transferred is lowered vertically toward the liquid substrate 20 such that it contacts with the upper side of the organic/inorganic thin film from which all the solvent contained in the solution 30 has evaporated. During this process, the organic/inorganic thin film is transferred as soon as it contacts with the target substrate 50. If the target substrate 50 is lifted vertically from the liquid substrate 20, the organic/inorganic thin film is separated from the liquid substrate 20 and the transfer is completed.

For example, the liquid substrate 20 may be a solvent which does not dissolve the organic/inorganic material and has a higher surface tension than the solvent, including distilled water, glycerol, formamide, ethylene glycol, etc.

Hereinafter, the present disclosure will be described in detail through a test example and examples.

However, the following test example and examples are for illustrative purposes only and the scope of the present disclosure is not limited by the examples.

Test Example 1

10 μL of a solution of PTB7:PC71BM in chlorobenzene was added dropwise onto 50 mL of water held in a Petri dish with a diameter of 10 cm at room temperature under an air atmosphere. A thin film was formed within 10 seconds as the organic solvent was completely dried.

Figure 2:
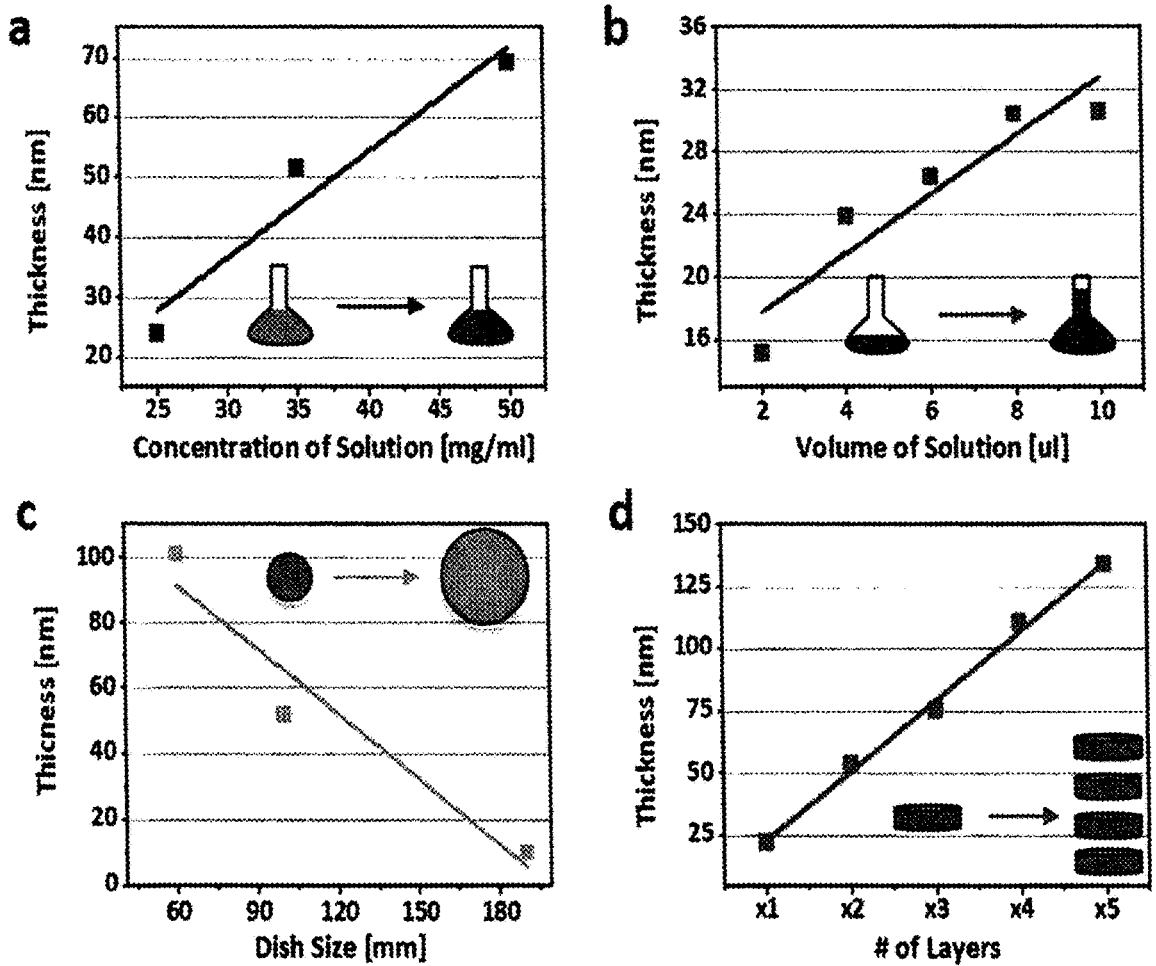
FIG. 2 shows increase and decrease of the thickness of a thin film formed by spontaneous spreading depending on the concentration and amount of a solution, the size of a container and the number of transferred thin films.

FIG. 2 shows the change in the thickness of the organic thin film due to spontaneous spreading.

Specifically, FIG. 2 shows the increase and decrease of the thickness of the thin film depending on the concentration and amount of the solution, the size of the container holding the water and the number of transferred thin films. That is to say, the figure shows increase and decrease of the thickness of the organic thin film formed through spontaneous spreading depending on the concentration and amount of the solution, the size of the container holding the water and the number of transferred thin films.

It can be seen that the thickness of the organic thin film increases with the concentration and amount of the solution and the number of transferred thin films and decreases with the size of the container holding the water.

Because the size of the formed thin film can be controlled by varying the size of the container (bath), it is possible to obtain a large-area thin film having uniform properties.

Figure 3:
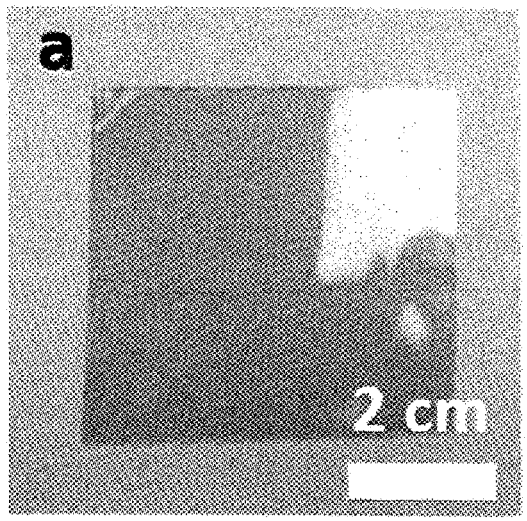
FIG. 3 shows that an organic/inorganic thin film is transferred regardless of the type or shape of a target substrate.
Figure 3:
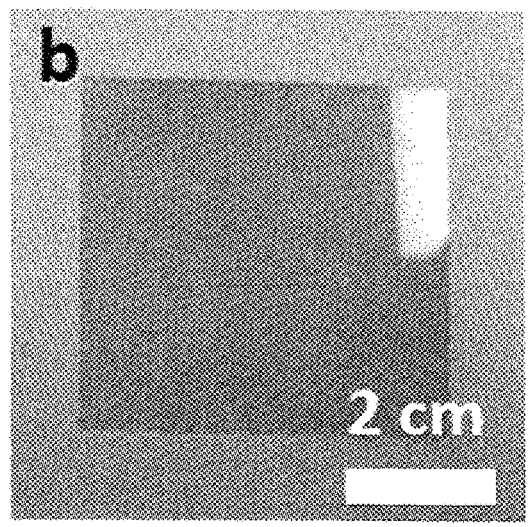
Figure 3:
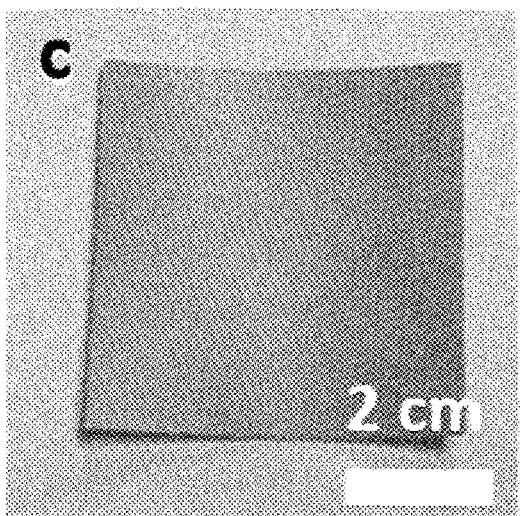
Figure 3:
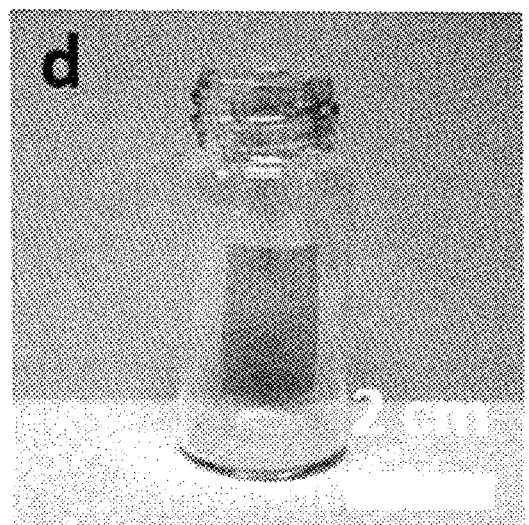

FIG. 3 shows that the organic/inorganic thin film is transferred regardless of the type or shape of a target substrate.

Specifically, FIG. 3 shows that the organic/inorganic thin film is transferred to target substrates formed of PDMS (a), PET (b), paper (c) and glass (d). It can be seen that the transfer is achieved as desired regardless of the type or shape of the target substrate.

Figure 4:
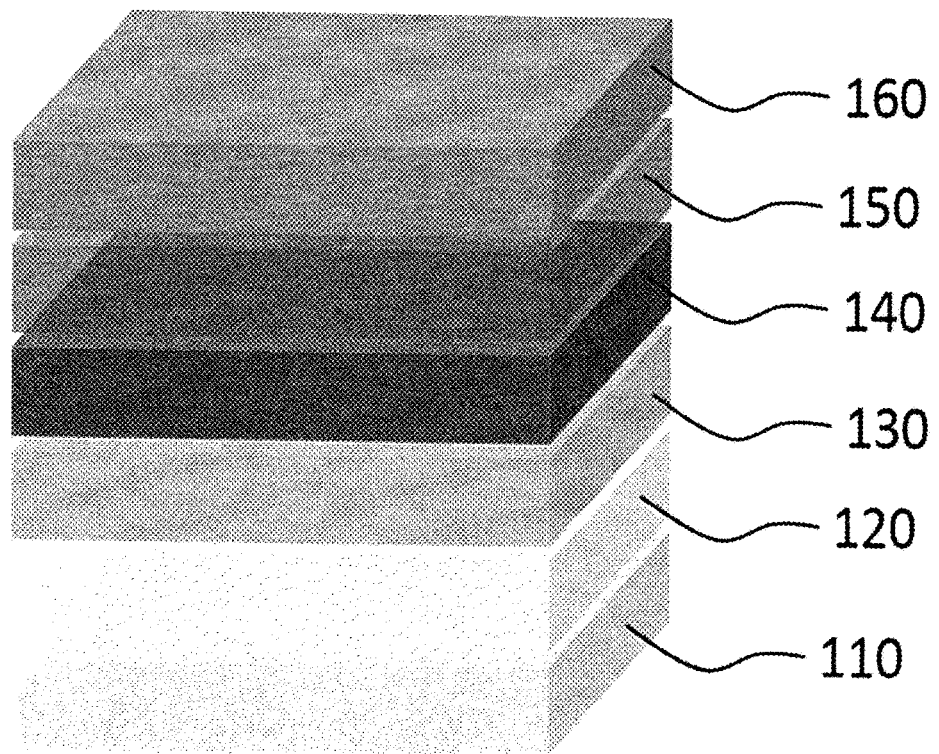
FIG. 4 shows the structure of an organic solar cell or an organic light-emitting diode to which an organic thin film prepared according to the present disclosure is applied.

FIG. 4 shows the structure of an organic solar cell or an organic light-emitting diode to which the organic thin film prepared according to the present disclosure is applied. Hereinafter, examples and comparative examples are described referring to FIG. 4.

First, comparative examples are described referring to FIG. 4.

Comparative Example 1: Fabrication of Organic Solar Cell by Using Spin Coating Method As an anode layer 120, transparent ITO having a sheet resistance of 15 Ω/sq and a thickness of ~1,500 Å was prepared on a glass substrate 110. The glass substrate on which the ITO anode layer was formed was ultrasonically washed with acetone and isopropyl alcohol for 15 minutes each and then dried. Then, the ITO substrate was surface-treated for 10 minutes using an atmospheric plasma surface-treating apparatus Then, as a hole transport layer 130, polyethylenedioxythiophene polystyrene sulfonate (PEDOT:PSS) was spin-coated on the ITO anode layer to a thickness of 40 nm. The substrate was dried at 140° C. for 15 minutes and transferred to a glovebox under a dry nitrogen atmosphere of 1 ppm or lower oxygen. Then, a photoactive layer 140 with a thickness of 100 nm was formed by spin-coating a solution prepared by dissolving 15 mg of regioregular poly(trihexylthiophene) (P3HT) as an electron donor and 12 mg of the fullerene derivative [6,6]-phenyl-$C_{61}$-butyric acid methyl ether (PCBM) as an electron acceptor in 1 mL of chlorobenzene on the hole transport layer. Then, the substrate was dried at 50° C. for 40 minutes.

Next, the substrate was loaded in a vacuum deposition apparatus and an organic solar cell was obtained by forming lithium fluoride as a cathode layer of a counter electrode on the photoactive layer to a thickness of 0.5 nm and then forming an Al thin film with a thickness of 100 nm by vacuum deposition, thereby forming a double-layered cathode layer 150,160.

Figure 6:
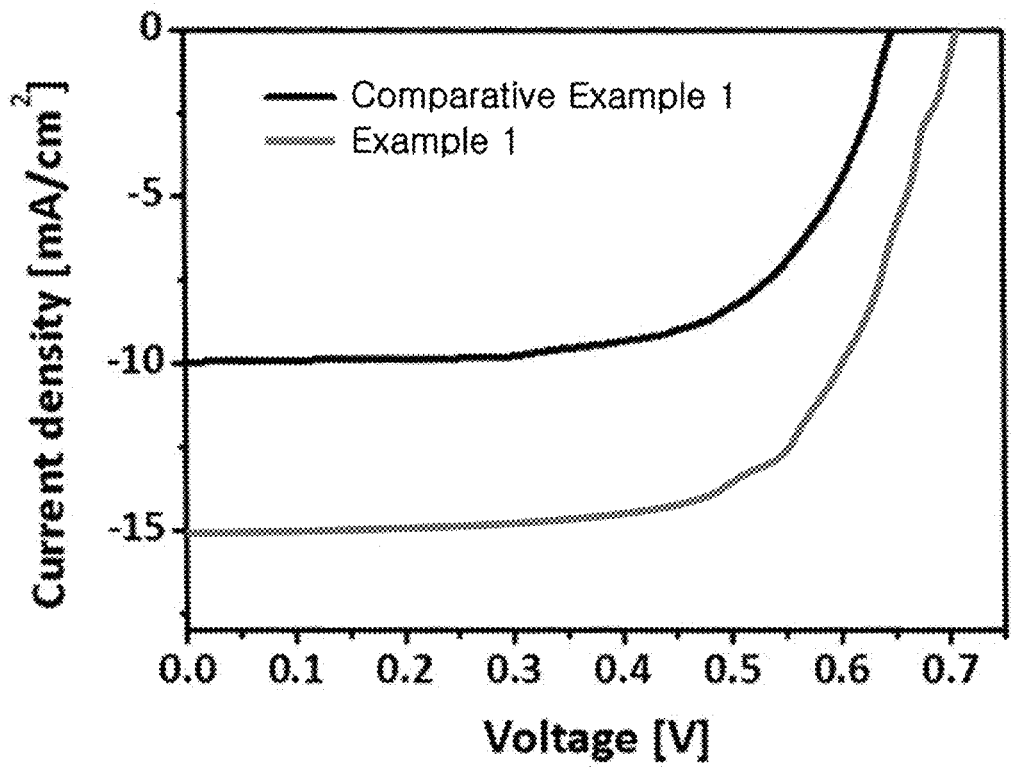
FIG. 6 shows the current-voltage curve of an organic solar cell fabricated in Example 1 and Comparative Example 1.

The voltage-current density measurement result of the organic solar cell device fabricated by the spin coating method in Comparative Example 1 is shown in FIG. 6.

The $V_{oc}$, $J_{sc}$ and FF of the fabricated organic solar cell were measured to be 0.62, 10.9 and 64.2%, respectively. The photovoltaic conversion rate was 4.4%.

Hereinafter, the examples of the present disclosure are described referring again to FIG. 4.

Example 1: Fabrication of Organic Solar Cell Device by Using Spontaneous Spreading Effect I In this example, an organic solar cell was fabricated in the same manner as in Comparative Example 1, except that 10 μL of a solution prepared by dissolving 15 mg of P3HT and 12 mg of the fullerene derivative PCBM in 1 mL of chlorobenzene was dropped onto distilled water as a liquid substrate and an organic photoactive layer was formed by using the spontaneous spreadingeffect caused by the difference in surface tension between the two solutions and then transferred onto a hole transport layer.

The $V_{oc}$, $J_{sc}$ and FF of the fabricated organic solar cell were measured to be 0.67, 13.7 and 69%, respectively. The photovoltaic conversion rate was 6.3%. The voltage-current density measurement result is shown in FIG. 6.

Example 2: Fabrication of Organic Solar Cell Device by Using Spontaneous Spreading Effect II An organic solar cell was fabricated in the same manner as in Comparative Example 1, except that ITO having a sheet resistance of 30 Ω/sq and a thickness of ~1,500 Å was prepared on a PEN substrate, 10 μL of a solution prepared by dissolving 10 mg of PTB7 and 15 mg of PC70BM in 1 mL of a 90:10 (v/v) solvent mixture of chlorobenzene and 1,8-diidooctane (DIO) was dropped onto distilled water as a liquid substrate and an organic photoactive layer was formed by using the spontaneous spreadingeffect caused by the difference in surface tension between the two solutions and then transferred onto a hole transport layer.

The $V_{oc}$, $J_{sc}$ and FF of the fabricated organic solar cell were measured to be 0.75, 14.7 and 68%, respectively. The photovoltaic conversion rate was 7.3%.

Example 3: Fabrication of Organic Solar Cell Device by Using Spontaneous Spreading Effect III An organic solar cell was fabricated in the same manner as in Comparative Example 1, except that 15 μL of a solution prepared by dissolving 15 mg of PTB7 and 10 mg of the polyperylene derivative PNDI in 1 mL of a 99.5:0.5 (v/v) solvent mixture of chlorobenzene and 1,8-diidooctane (DIO) was dropped onto distilled water as a liquid substrate and an organic photoactive layer was formed by using the spontaneous spreading effect caused by the difference in surface tension between the two solutions and then transferred onto a hole transport layer.

The $V_{oc}$, $J_{sc}$ and FF of the fabricated organic solar cell were measured to be 0.81, 18.8 and 51%, respectively. The photovoltaic conversion rate was 7.7%.

Example 4: Fabrication of Organic Solar Cell Device by Using Spontaneous Spreading Effect IV An organic solar cell was fabricated in the same manner as in Comparative Example 1, except that 10 μL of a solution prepared by dissolving 15 mg of PTB7-Th in a 95:5 (v/v) solvent mixture of chlorobenzene and 1,8-diidooctane (DIO) was dropped onto acetone as a liquid substrate, an electron donor layer was formed by using the spontaneous spreading effect caused by the difference in surface tension between the two solutions and then transferred onto a hole transport layer, 15 μL of a solution prepared by dissolving 10 mg of the polyperylene derivative PNDI in 1 mL of chloroform was dropped onto distilled water as a liquid substrate and an electron acceptor layer was formed and transferred onto the electron donor layer.

Figure 7:
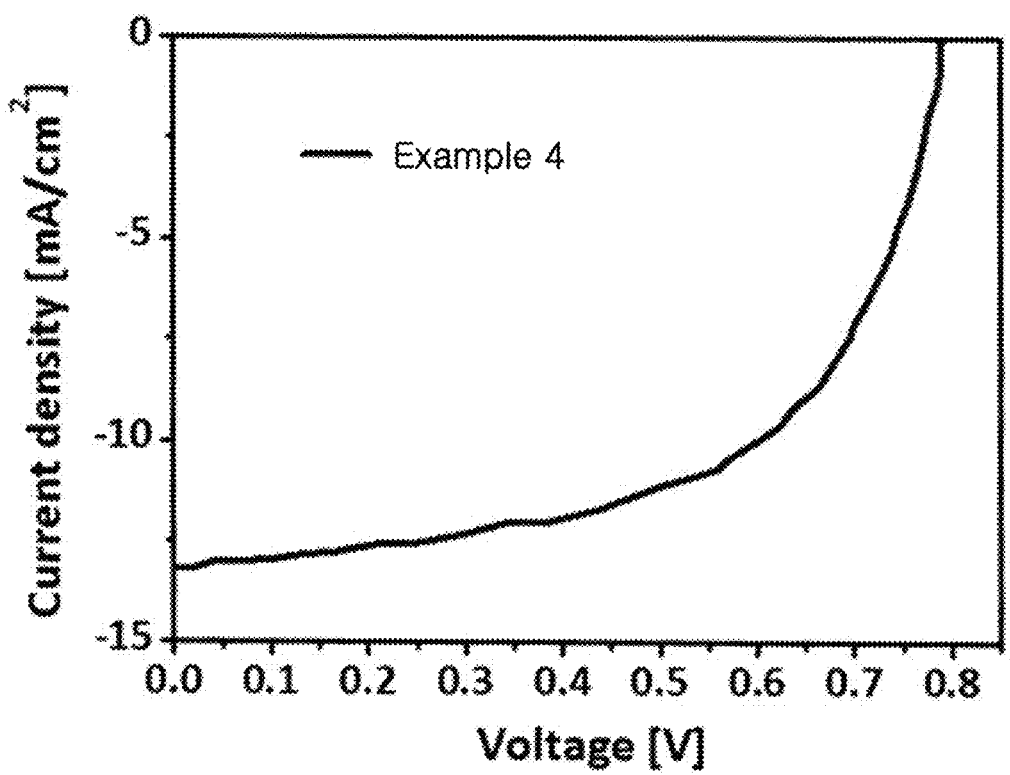
FIG. 7 shows the current-voltage curve of an organic solar cell fabricated in Example 4.

The $V_{oc}$, $J_{sc}$ and FF of the fabricated organic solar cell were measured to be 0.79, 13.46 and 56%, respectively. The photovoltaic conversion rate was 5.96%. The voltage-current density measurement result of the device is shown in FIG. 7.

Comparative Example 2: Fabrication of Organic/Inorganic Hybrid Perovskite Solar Cell Device by Using Spin Coating Method A glass substrate on which FTO having a sheet resistance of 20 Ω/sq was deposited as a cathode layer was ultrasonically washed with distilled water, acetone and isopropyl alcohol for 15 minutes each and then dried. Then, the FTO substrate was surface-treated for 10 minutes using an atmospheric plasma surface-treating apparatus.

Then, ZnO nanoparticles were spin-coated on the FTO cathode layer to a thickness of 40 nm as an electron transport layer. The substrate was dried at room temperature and transferred to a glovebox under a dry nitrogen atmosphere of 1 ppm or lower oxygen. Then, a photoactive layer with a thickness of 270 nm was formed by coating a 1.2 M methylammonium lead triiodide ($CH_3NH_3PbI_3$) solution prepared by dissolving methylammonium iodide ($CH_3NH_3I$) and lead diiodide ($PbI_2$) in a 7:3 (v/v) solvent mixture of y-butyrolactone and dimethyl sulfoxide at a molar ratio of 1:1 and stirring at 60° C. for 12 hours on the electron transport layer. Then, the substrate was dried at 100° C. for 10 minutes.

Next, the substrate was loaded in a vacuum deposition apparatus and a hole transport layer was formed by adding 13.6 μL of Li-bis(trifluoromethanesulfonyl)imide (Li-TFSI)/acetonitrile (28.3 mg/1 mL) and 6.8 μL of TBP to a poly(triarylamine) (PTAA) solution dissolved in toluene to 15 mg/mL and spin-coating the solution on the photoactive layer. An organic/inorganic hybrid perovskite solar cell was obtained by forming Ag thin film with a thickness of 100 nm as a cathode layer of a counter electrode on the photoactive layer by vacuum deposition.

Figure 8:
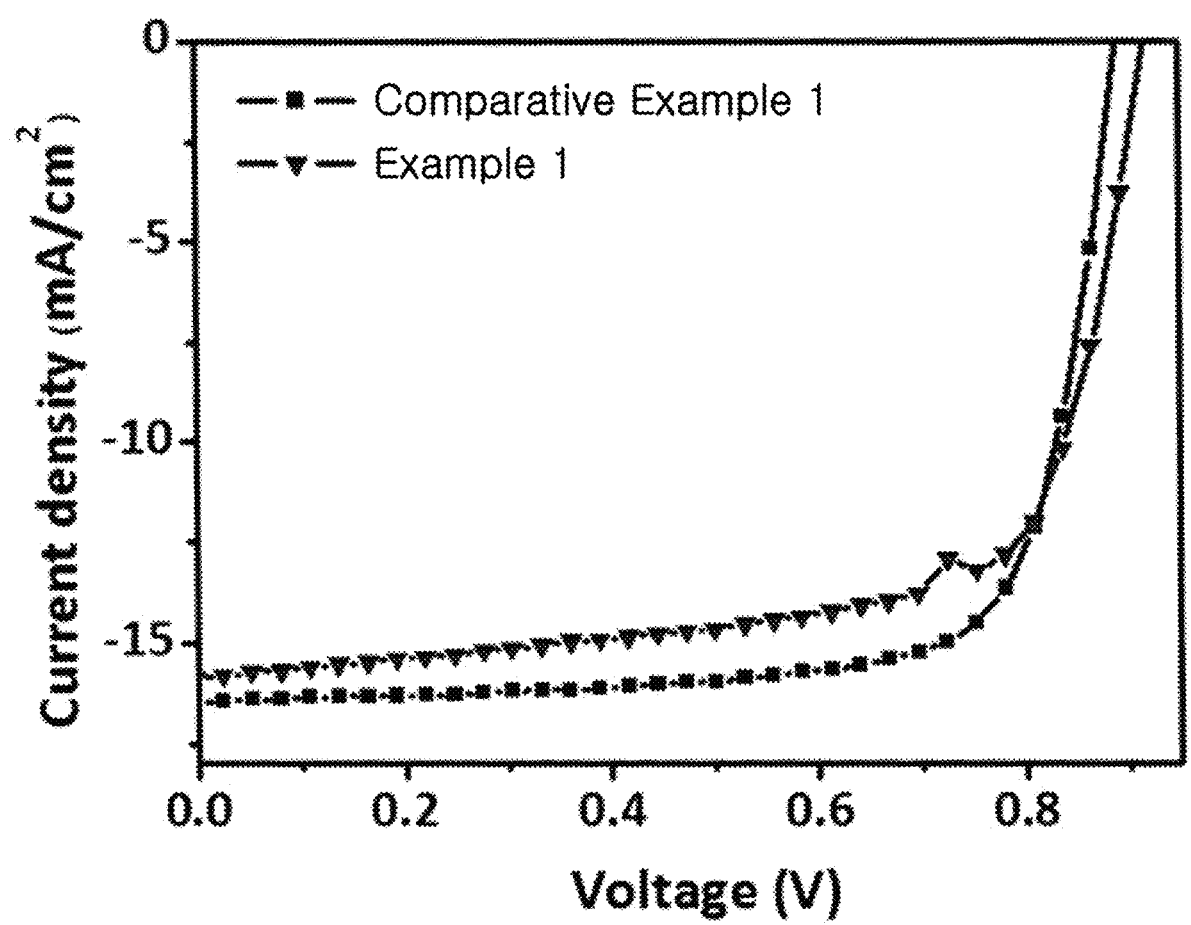
FIG. 8 shows the current-voltage curve of an organic/inorganic hybrid solar cell fabricated in Example 5 and Comparative Example 2.

The voltage-current density measurement result of the organic/inorganic hybrid perovskite solar cell device fabricated by the spin coating method in Comparative Example 2 is shown in FIG. 8.

The $V_{oc}$, $J_{sc}$ and FF of the fabricated organic solar cell were measured to be 0.94, 16.72 and 69%, respectively. The photovoltaic conversion rate was 10.16%.

Example 5: Fabrication of Organic/Inorganic Hybrid Perovskite Solar Cell Device by Using Spontaneous Spreading Effect V An organic/inorganic hybrid perovskite solar cell was fabricated in the same manner as in Comparative Example 1, except that 20 μL of a 1.2 M methylammonium lead triiodide ($CH_3NH_3PbI_3$) solution prepared by dissolving methylammonium iodide ($CH_3NH_3I$) and lead diiodide ($PbI_2$) in a 7:3 (v/v) solvent mixture of y-butyrolactone and dimethyl sulfoxide at a molar ratio of 1:1 and stirring at 60° C. for 12 hours was dropped on acetone as a liquid substrate and a photoactive layer was formed by using the spontaneous spreading effect caused by the difference in surface tension between the two solutions and then transferred onto a hole transport layer, which was then dried at 100° C. for 10 minutes.

The $V_{oc}$, $J_{sc}$ and FF of the fabricated organic/inorganic hybrid perovskite solar cell were measured to be 0.89, 16.49 and 74%, respectively. The photovoltaic conversion rate was 10.91%. The voltage-current density measurement result of the device is shown in FIG. 8.

Comparative Example 3: Fabrication of Polymer Light-Emitting Diode by Using Spin Coating Method An organic light-emitting diode having a structure shown in FIG. 4 was fabricated. In this comparative example, the photoactive layer 140 of Comparative Example 1 was replaced by a light-emitting layer 140.

A PEDOT:PSS hole transport layer with a thickness of about 40 nm was formed on a PET/ITO substrate pretreated as in Comparative Example 1 using a spin coater. After heat treatment at 130° C. for 20 minutes, a solution in which a light-emitting polymer (Merck super yellow polymer, PDY-132) was dissolved in toluene to a concentration of 0.5 wt % was spin-coated on the hole transport layer to obtain a thin film with a thickness of 100 nm. The thin film was heat-treated at 90° C. for 30 minutes. The substrate was loaded in a vacuum deposition apparatus and a polymer light-emitting diode was obtained by forming lithium fluoride as a cathode layer of a counter electrode on the light-emitting layer to a thickness of 0.5 nm and then forming an Al thin film with a thickness of 100 nm by vacuum deposition, thereby forming a double-layered cathode layer.

Example 6: Fabrication of Polymer Light-Emitting Diode by Using Spontaneous Spreading Effect VI A polymer light-emitting diode was fabricated in the same manner as in Comparative Example 3, except that 10 μL of a solution in which a light-emitting polymer (Merck super yellow polymer, PDY-132) was dissolved in toluene to a concentration of 0.5 wt % was dropped on distilled water as a liquid substrate and a light-emitting layer was formed by using the spontaneous spreading effect caused by the difference in surface tension between the two solutions and then transferred onto a hole transport layer.

Example 7: Fabrication of Organic/Inorganic Hybrid Perovskite Light-Emitting Diode by Using Spontaneous Spreading Effect VII A polymer light-emitting diode was fabricated in the same manner as in Comparative Example 3, except that methylammonium bromide and lead dibromide were dissolved in dimethyl sulfoxide at a molar ratio of 1:1 to a concentration of 10 wt %, methylammonium chloride and lead dichloride were similarly dissolved in dimethyl sulfoxide at a molar ratio of 1:1 to a concentration of 10 wt %, the two solutions were mixed at a volume ratio of 1:1, 20 μL of the mixture was dropped onto chloroform as a liquid substrate and a light-emitting layer was formed by using the spontaneous spreading effect caused by the difference in surface tension between the two solutions and then transferred onto a hole transport layer.

Figure 5:
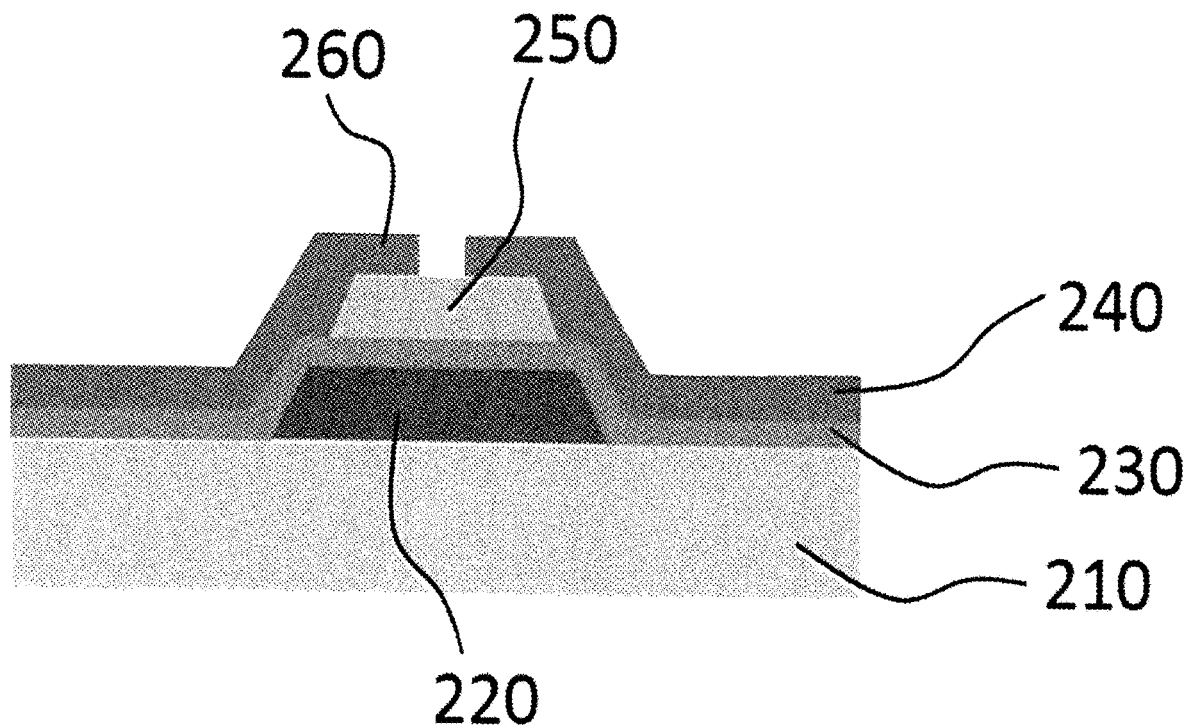
FIG. 5 shows the structure of an organic thin-film transistor to which an organic thin film prepared according to the present disclosure is applied.

Example 8: Fabrication of Organic Thin-Film Transistor by Using Spontaneous Spreading Effect VIII An organic thin-film transistor having a structure shown in FIG. 5 was fabricated.

As a gate electrode 220, ITO was deposited on a polyethersulfone (PES) substrate 210 by pulsed laser deposition. A polymer gate insulation layer 230 was prepared by mixing 8 wt % PVP and 1.6 wt % MMF with a PGMEA solvent, dropping 20 μL of the PVP solution on IPA as a liquid substrate and forming a thin film by using the spontaneous spreading effect caused by the difference in surface tension between the two solutions and then transferred onto the ITO electrode. For removal of the solvent, the substrate was heat-treated on a hot plate at 90° C. for 90 seconds inside a glovebox under a nitrogen atmosphere and then treated with UV and ozone for 10 minutes.

Then, the substrate was further heat-treated at 90° C. for 1 hour for curing and crosslinking of PVP. In order to increase pentacene grain size and induce growth in the (001) direction, the surface of the insulation layer was treated with oxygen plasma, HMDS and OTS before forming a semiconductor layer 250. A pentacene layer with a thickness of 300 Å was deposited by thermal evaporation at a pressure of $3.0 \times 10^{-7}$ Torr. An organic thin-film transistor was fabricated by depositing a source electrode 260 and a silver drain electrode 240 with a thickness of 100 nm on the semiconductor layer by thermal deposition using a shadow mask.

As described above, the present disclosure relates to a method for forming a thin film on a liquid substrate by using the surface tension between the liquid substrate and a solution and allows for fabrication of an organic/inorganic electronic device including a high-performance organic solar cell with an effectively controlled nanomorphology.

According to the present disclosure, a large-area thin film can be formed effectively with little material loss and the process is very simple because the formed thin film can be transferred freely to a glass, plastic or metal substrate without limitation.

Those skilled in the art will appreciate that the conceptions and specific embodiments disclosed in the foregoing description may be readily utilized as a basis for modifying or designing other embodiments for carrying out the same purposes of the present disclosure. Those skilled in the art will also appreciate that such equivalent embodiments do not depart from the spirit and scope of the disclosure as set forth in the appended claims.

The invention claimed is:

1. An ultra-fast method for formation of an organic/inorganic thin film by using a spontaneous spreading effect, comprising:
    a step of accommodating a liquid substrate in a container, wherein the liquid substrate is a solvent which does not dissolve organic/inorganic materials;
    a step of preparing a solution by dissolving one or more organic/inorganic material in a solvent, wherein the solvent of the liquid substrate has a higher surface tension than the solvent of the solution;
    a step of forming an organic/inorganic thin film by supplying the prepared solution onto a liquid substrate; and
    a step of transferring the formed thin film to a substrate by lowering the substrate vertically toward the liquid substrate, and vertically raising the substrate on which the thin film has been transferred to separate from the liquid substrate,
    wherein, in the step of forming the organic/inorganic thin film, the organic/inorganic material forms the thin film on the liquid substrate through a spontaneous spreading phenomenon caused by a difference in surface tension between the liquid substrate and the solution and through evaporation of the solvent and a dissolution process of the solvent to the liquid substrate.

2. The method of claim 1, wherein, in the step of forming the organic/inorganic thin film, a single-layer or multi-layer thin film is formed on the liquid substrate by a solution wherein a single or composite organic/inorganic material is dissolved in a solvent.

3. The method of claim 2, wherein the organic/inorganic material comprises one or more of an organic compound comprising a conjugated polymer or a conjugated small molecule such as a polybenzothiophene derivative, a polythiophene derivative, a poly(p-phenylene) derivative, a polyfluorene derivative, a polyacetylene derivative, a polypyrrole derivative, a polyvinylcarbazole derivative, a polyaniline derivative and a polyphenylenevinylene derivative, an n-type polymer compound such as a polyperylene derivative, a fullerene derivative such as fullerene ($C_{60}$), [6,6]-phenyl-$C_{61}$-butyric acid methyl ether (PCBM), [6,6]-phenyl-$C_{71}$-butyric acid methyl ether (PC70BM), an inorganic/organic hybrid perovskite compound of a perovskite structure comprising an amidinium ion and an organic ammonium ion as monovalent organic cations, a divalent metal ion as an inorganic cation and a halogen ion as an anion, or an inorganic semiconductor quantum dot compound selected from CdS, CdSe, CdTe, PbS, PbSe, $PbS_xSe_{1-x}$ (0<x<1), $Bi_2S_3$, $Bi_2Se_3$, InP, $InCuS_2$, In(CuGa)$Se_2$, $Sb_2S_3$, $Sb_2Se_3$, $SnS_x$ (1≤x≤2), NiS, CoS, $FeS_x$ (1≤x≤2), $In_2S_3$, MoS and MoSe.

4. The method of claim 2, wherein the liquid substrate is one having a higher surface tension than the solvent, selected from a group consisting of distilled water, glycerol, formamide and ethylene glycol.

5. The method of claim 2, wherein the solvent is one capable of dissolving the organic/inorganic material and having a difference in surface tension with the liquid substrate such that a spontaneous spreading effect can occur, selected from a group consisting of chlorobenzene, chloroform, toluene and dichlorobenzene.

6. The method of claim 1, wherein the substrate to which the organic/inorganic thin film is transferred is one of a flexible polymer substrate, a metal substrate and a glass substrate.

7. The method of claim 6, wherein the flexible polymer substrate is one selected from a group consisting of polydimethylsiloxane (PDMS), polyethylene terephthalate (PET), polyethylene naphthalate (PEN) polyethylene (PE), polyethersulfone (PES), polycarbonate (PC), polyarylate (PAR) and polyimide (PI).

8. The method of claim 6, wherein the metal substrate is one selected from a group consisting of SUS (steel use stainless), aluminum, steel and copper.

9. An organic/inorganic thin film prepared by the method for preparing an organic/inorganic thin film by using a spontaneous spreading effect of claim 1.

10. An organic/inorganic electronic device comprising the organic/inorganic thin film of claim 9.

11. The organic/inorganic electronic device of claim 10, wherein the organic/inorganic electronic device is one of a solar cell, a light-emitting diode and a transistor.

* * * * *